(12) United States Patent
Zhu (10) Patent No.: US 12,048,183 B2
(45) Date of Patent: Jul. 23, 2024

(54) DISPLAY PANEL AND COVER PLATE ASSEMBLY

(71) Applicant: WUHAN CHINA STAR OPTOELECTRONICS SEMICONDUCTOR DISPLAY TECHNOLOGY CO., LTD., Hubei (CN)

(72) Inventor: Defu Zhu, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 17/754,229

(22) PCT Filed: Feb. 10, 2022

(86) PCT No.: PCT/CN2022/075875
§ 371 (c)(1),
(2) Date: Mar. 28, 2022

(87) PCT Pub. No.: WO2023/137805
PCT Pub. Date: Jul. 27, 2023

(65) Prior Publication Data
US 2024/0057371 A1 Feb. 15, 2024

(30) Foreign Application Priority Data
Jan. 19, 2022 (CN) .......................... 202210058279.3

(51) Int. Cl.
*H10K 50/842* (2023.01)
*H10K 50/844* (2023.01)
*H10K 50/85* (2023.01)

(52) U.S. Cl.
CPC ....... *H10K 50/8426* (2023.02); *H10K 50/844* (2023.02); *H10K 50/85* (2023.02)

(58) Field of Classification Search
CPC ... H10K 50/8426; H10K 50/844; H10K 50/85
See application file for complete search history.

(56) References Cited

U.S. PATENT DOCUMENTS

2020/0111845 A1* 4/2020 Shigemura ................ B32B 7/02
2020/0365823 A1 11/2020 Yug
(Continued)

FOREIGN PATENT DOCUMENTS

CN 102362304 A 2/2012
CN 2012226111 A 11/2012
(Continued)

OTHER PUBLICATIONS

English Machine Translation of Wang WO2021213049 (Year: 2023).*
(Continued)

*Primary Examiner* — Donald L Raleigh
(74) *Attorney, Agent, or Firm* — PV IP PC; Wei Te Chung; Zhigang Ma (57) ABSTRACT

The present application provides a display panel and a cover plate assembly. The display panel includes: a light-emitting layer; a first adhesive layer arranged on a light-emitting surface of the light-emitting layer; a cover plate arranged on one side of the first adhesive layer away from the light-emitting layer; a second adhesive layer arranged on one side of the cover plate away from the first adhesive layer; and a protective layer arranged on one side of the second adhesive layer away from the cover plate. An orthographic projection of at least a portion of an edge of the second adhesive layer projected on the cover plate is located between two opposite edges of the cover plate.

20 Claims, 3 Drawing Sheets

(56) References Cited

U.S. PATENT DOCUMENTS

| | | | |
|---|---|---|---|
| 2021/0288288 A1 | 9/2021 | Chen | |
| 2022/0344426 A1* | 10/2022 | Wang | ............... H10K 50/87 |

FOREIGN PATENT DOCUMENTS

| | | | | |
|---|---|---|---|---|
| CN | 103338606 A | 10/2013 | | |
| CN | 104204875 A | 12/2014 | | |
| CN | 108091256 A | 5/2018 | | |
| CN | 108107619 A | 6/2018 | | |
| CN | 109313299 A | 2/2019 | | |
| CN | 109844847 A | 6/2019 | | |
| CN | 110416273 A | 11/2019 | | |
| CN | 110556057 A | 12/2019 | | |
| CN | 111952337 A | 11/2020 | | |
| CN | 112735278 A | 4/2021 | | |
| CN | 112885243 A | 6/2021 | | |
| CN | 112908166 A | 6/2021 | | |
| CN | 112967603 A | 6/2021 | | |
| CN | 113066816 A | 7/2021 | | |
| CN | 113823196 A | 12/2021 | | |
| CN | 215182809 U | 12/2021 | | |
| TW | 201628846 A | 8/2016 | | |
| WO | 2014041993 A1 | 3/2014 | | |
| WO | 2016104978 A1 | 6/2016 | | |
| WO | 2019205435 A1 | 10/2019 | | |
| WO | WO-2021213049 A1 * | 10/2021 | ......... | H01L 27/3262 |
| WO | WO-2022246768 A1 * | 12/2022 | ............ | H01L 27/32 |

OTHER PUBLICATIONS

Chinese Office Action issued in corresponding Chinese Patent Application No. 202210058279.3 dated Apr. 22, 2023, pp. 1-10.
International Search Report in International application No. PCT/CN2022/075875, mailed on Sep. 26, 2022.
Written Opinion of the International Searching Authority in International application No. PCT/CN2022/075875, mailed on Sep. 26, 2022.

* cited by examiner

DISPLAY PANEL AND COVER PLATE ASSEMBLY

CROSS REFERENCE TO RELATED APPLICATIONS

The present application claims the priority of China Patent Application No. 202210058279.3, filed with the National Intellectual Property Administration on Jan. 19, 2022, titled "DISPLAY PANEL AND COVER PLATE ASSEMBLY", which is incorporated by reference in the present application in its entirety.

FIELD OF DISCLOSURE

The present application relates to a field of display technology and in particular, to a display panel and a cover plate assembly.

DESCRIPTION OF RELATED ART

In recent years, flexible foldable screens have become more and more favored by terminal mobile phone manufacturers, and more and more mobile phone manufacturers have begun to launch their own foldable mobile phones. Since a flexible screen module is basically made of stacked plastic films, a screen surface has relatively poor scratch resistance and impact resistance. Currently, ultra-thin glass is used as a cover plate to improve surface characteristics of the screen. Although ultra-thin glass can be bent, it also has brittleness of glass. Therefore, in using the ultra-thin glass, it is necessary to avoid direct collision, especially edge collision. When individual parts are supplied, an edge of the ultra-thin glass is usually protected by expanded protective films. The protective films are arranged on two sides of the ultra-thin glass, and an intermediate protective layer is bonded between one side of the ultra-thin glass and the protective film through an optical adhesive. During use, the protective films on two sides are peeled off, thereby leaving the ultra-thin glass, the optical adhesive on one side of the ultra-thin glass, and the intermediate protective layer to be assembled with the display module assembly. However, when the protective film is peeled off, the protective film disposed on one side of the ultra-thin glass is prone to adhere to the optical adhesive on the other side of the ultra-thin glass, resulting in failure of peeling off the protective film and easily causing warpage or damage to the ultra-thin glass.

Conventional display panels have a technical problem that a protective film and an optical adhesive on two sides of a glass cover can adhere to each other during a manufacturing process, which makes it difficult to remove the protective film.

SUMMARY

The present application provides a display panel and a cover plate assembly for alleviating a technical problem of conventional display panels, in which a protective film and an optical adhesive on two sides of a glass cover can adhere to each other during a manufacturing process, which makes it difficult to remove the protective film.

The present application provides a display panel, comprising:
a light-emitting layer;
a first adhesive layer disposed on a light-emitting surface of the light-emitting layer and connected to the light-emitting layer;
a cover plate disposed on one side of the first adhesive layer away from the light-emitting layer and connected to the first adhesive layer;
a second adhesive layer disposed on one side of the cover plate away from the first adhesive layer and connected to the cover plate; and
a protective layer arranged on one side of the second adhesive layer away from the cover plate and connected to the second adhesive layer.

In the display panel of the present application, an orthographic projection of at least a portion of an edge of the second adhesive layer projected on the cover plate is located between two opposite edges of the cover plate.

In the display panel according to the present application, a minimum distance between an edge of an orthographic projection of the cover plate projected on the protective layer and an edge of the protective layer is less than a minimum distance between an edge of an orthographic projection of the second adhesive layer projected on the protective layer and the edge of the protective layer.

In the display panel according to the present application, the display panel comprises a plurality of corner regions; and in at least one of the corner regions, a minimum distance between an edge of an orthographic projection of the cover plate projected on the protective layer and an edge of the protective layer is less than a minimum distance between an edge of an orthographic projection of the second adhesive layer projected on the protective layer and the edge of the protective layer.

In the display panel according to the present application, in at least one of the corner regions, an orthographic projection of the second adhesive layer projected on the protective layer comprises an indented portion and a protruding portion adjacent to the indented portion, and a distance between an edge of the indented portion and an edge of the protruding portion is greater than or equal to 1 mm.

In the display panel according to the present application, in at least one of the corner regions, a distance between an edge of an orthographic projection of the second adhesive layer projected on the cover plate and an edge of the cover plate is greater than 0.

In the display panel according to the present application, in at least one of the corner regions, a distance between an edge of an orthographic projection of the cover plate projected on the protective layer and the edge of the protective layer is greater than 0.

In the display panel according to the present application, a light-shielding layer is disposed on a surface of the protective layer facing the second adhesive layer, and the light-shielding layer is annular-shaped and disposed along an edge of the protective layer.

In the display panel according to the present application, the light-shielding layer comprises black ink coated on one side of the protective layer.

In the display panel according to the present application, a portion of a surface of the light-shielding layer facing the light-emitting layer is connected to the second adhesive layer, and other portions of the surface of the light-shielding layer facing the light-emitting layer are suspended.

In the display panel according to the present application, a surface of the light-shielding layer facing the light-emitting layer is connected to the cover plate and the first adhesive layer.

In the display panel according to the present application, a distance between the orthographic projection of at least the portion of the edge of the second adhesive layer projected on the cover plate and an edge of the cover plate is greater than or equal to 1 mm.

In the display panel according to the present application, the distance between the orthographic projection of the at least the portion of the edge of the second adhesive layer projected on the cover plate and the edge of the cover plate is greater than or equal to 3 mm.

In the display panel according to the present application, a shape of an orthographic projection of the second adhesive layer projected on the light-emitting layer is same as a shape of an orthographic projection of the cover plate projected on the light-emitting layer.

In the display panel according to the present application, the cover plate comprises glass, and a thickness of the glass is less than or equal to 30 micrometers.

The present application further provides a cover plate assembly for use in a display panel, wherein the cover plate assembly comprises:

a first protective film;
a cover plate disposed on one side of the first protective film;
a second adhesive layer disposed on one side of the cover plate away from the first protective film and connected to the cover plate, wherein an orthographic projection of at least a portion of an edge of the second adhesive layer projected on the cover plate is located between two opposite edges of the cover plate;
a protective layer arranged on one side of the second adhesive layer away from the cover plate and connected to the second adhesive layer; and
a second protective film disposed on one side of the protective layer away from the second adhesive layer.

In the cover plate assembly according to the present application, an orthographic projection of at least a portion of the edge of the second adhesive layer projected on the protective layer is located between two opposite edges of the protective layer.

In the cover plate assembly according to the present application, a minimum distance between an edge of an orthographic projection of the cover plate projected on the protective layer and an edge of the protective layer is less than a minimum distance between an edge of an orthographic projection of the second adhesive layer projected on the protective layer and the edge of the protective layer.

In the cover plate assembly according to the present application, a light-shielding layer is disposed on a surface of the protective layer facing the second adhesive layer, and the light-shielding layer is annular in shape and disposed along an edge of the protective layer.

In the cover plate assembly according to the present application, a distance between the orthographic projection of the at least the portion of the edge of the second adhesive layer projected on the cover plate and an edge of the cover plate is greater than or equal to 3 mm.

Advantages of the Present Application

The present application provides a display panel and a cover plate assembly. The display panel comprises: a light-emitting layer, a first adhesive layer disposed on a light-emitting surface of the light-emitting layer, a cover plate disposed on one side of the first adhesive layer away from the light-emitting layer, a second adhesive layer disposed on one side of the cover plate away from the first adhesive layer, a protective layer disposed on one side of the second adhesive layer away from the cover plate, and an orthographic projection of at least a portion of an edge of the second adhesive layer projected on the cover plate is located between two opposite edges of the cover plate. In the present application, the orthographic projection of at least the portion of the edge of the second adhesive layer projected on the cover plate is located within the cover plate and does not overlap with the edge of the cover plate, so that the second adhesive layer forms a partial indented structure relative to the cover plate. In a manufacturing process of the display panel, a protective film and the second adhesive layer respectively located on two sides of the cover plate do not adhere to each other in an area corresponding to the indented structure, so that the protective film is easily peeled off from the area corresponding to the indented structure, thus improving production yields of the display panel.

BRIEF DESCRIPTION OF DRAWINGS

In order to more clearly illustrate the embodiments of the present disclosure or related art, figures which will be described in the embodiments are briefly introduced hereinafter. It is obvious that the drawings are merely for the purposes of illustrating some embodiments of the present disclosure, and a person having ordinary skill in this field can obtain other figures according to these figures without inventive work.

DETAILED DESCRIPTION OF EMBODIMENTS

The present application is described below with reference to the accompanying drawings and in conjunction with specific embodiments. Directional terms mentioned in the present application, such as "upper", "lower", "front", "rear", "left", "right", "inner", "outer", and "side", are only for illustration based on the directions of the accompanying drawings. Therefore, the directional terms are used to describe and understand the present application, rather than to limit the present application. In the drawings, structurally similar elements are denoted by the same reference numerals.

The present application provides a display panel and a cover plate assembly. The display panel comprises: a light-emitting layer, a first adhesive layer disposed on a light-emitting surface of the light-emitting layer, a cover plate disposed on one side of the first adhesive layer away from the light-emitting layer, a second adhesive layer on one side of the cover plate away from the first adhesive layer, a protective layer disposed on one side of the second adhesive layer away from the cover plate, and an orthographic projection of at least a portion of an edge of the second adhesive layer projected on the cover plate is located between two opposite edges of the cover plate. In the present application, the orthographic projection of at least the portion of the edge of the second adhesive layer projected on the cover plate is located within the cover plate and does not overlap with the edge of the cover plate, so that the second adhesive layer forms a partial indented structure relative to the cover plate. In a manufacturing process of the display panel, a protective film and the second adhesive layer respectively located on two sides of the cover plate do not adhere to each other in an area corresponding to the indented structure, so that the protective film is easily peeled off from the area corresponding to the indented structure, thus improving production yields of the display panel.

Related technical features of the display panel of the present application are described below with reference to the accompanying drawings.

Figure 1:
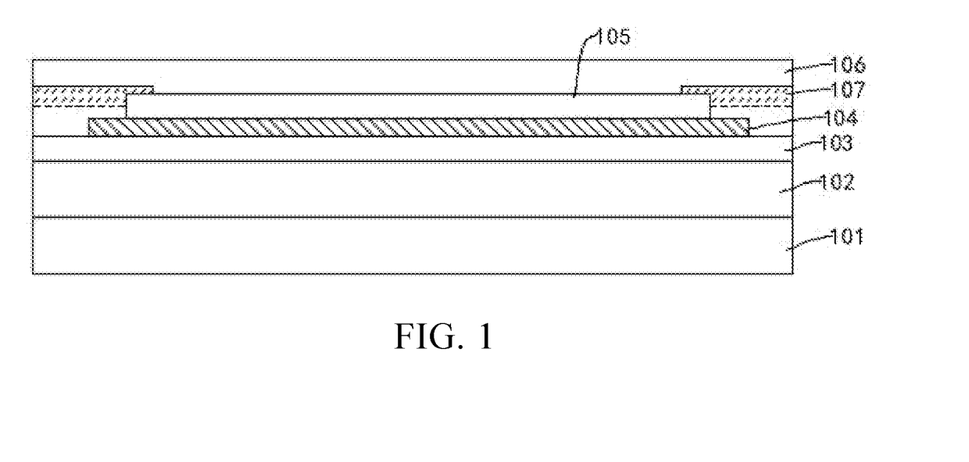
FIG. 1 is a schematic structural view of at least a portion of a film layer structure of a display panel according to one embodiment of the present application.
Figure 2:
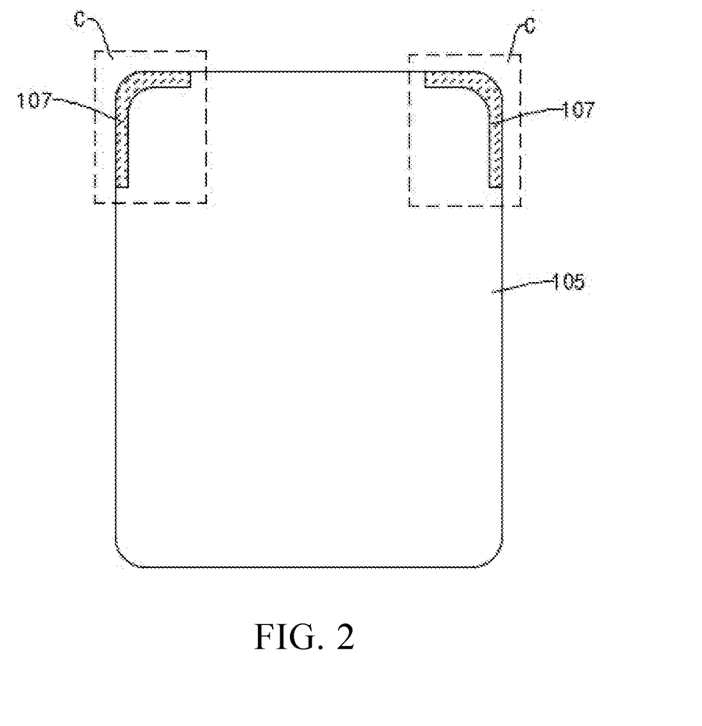
FIG. 2 is a partial structural view illustrating the film layer structure of the display panel according to a first embodiment of the present application.
Figure 3:
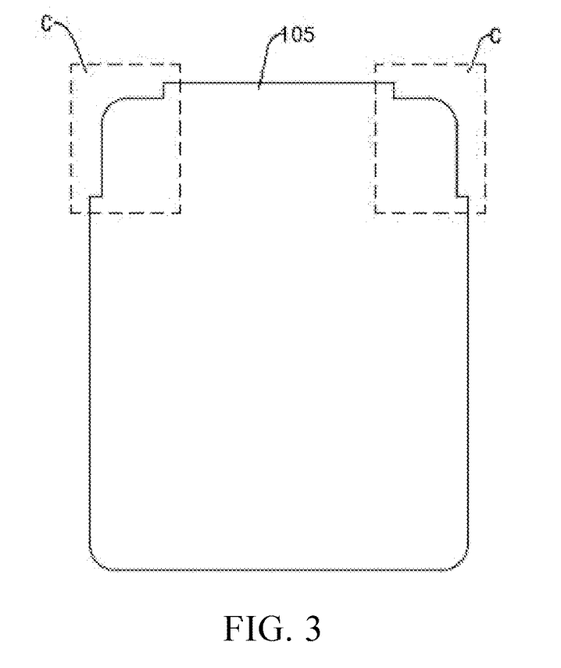
FIG. 3 is a schematic planar view illustrating a second adhesive layer in the display panel according to the first embodiment of the present application.

Please refer to FIGS. 1 to 3. FIG. 1 is a schematic view of at least a portion of a film layer structure of a display panel according to one embodiment of the present application. FIG. 2 is a partial structural view illustrating the display panel according to a first embodiment of the present application. FIG. 3 is a planar view illustrating a second adhesive layer in the display panel according to the first embodiment of the present application. Optionally, the display panel can be an organic light-emitting diode display panel, a micro light-emitting diode display panel, a liquid crystal display panel, etc. The present application uses an organic light-emitting diode display panel as an example for description, but is not limited in this regard.

The present application provides a display panel. The display panel comprises a base layer 101, a light-emitting layer 102 disposed on one side of the base layer 101, a first adhesive layer 103 disposed on one side of the light-emitting layer 102 away from the base layer 101, a cover plate 104 disposed on one side of the first adhesive layer 103 away from the light-emitting layer 102, a second adhesive layer 105 disposed on one side of the cover plate 104 away from the first adhesive layer 103, and a protective layer 106 disposed on one side of the second adhesive layer 105 away from the cover plate 104.

The base layer 101 can comprise a base substrate and a driving circuit layer disposed on the base substrate, and can also comprise film layers such as a buffer layer and a shielding layer disposed between the base substrate and the driving circuit layer. The base substrate can be a glass substrate or a polyimide substrate. The driving circuit layer is used to provide driving signals and provide control signals for the light-emitting layer 102 to achieve its light-emitting function. The driving circuit layer can comprise various wirings, such as scan lines and data lines, and can also comprise various electronic components, such as thin film transistor devices and capacitors. The film layer structure of the driving circuit layer can comprise a semiconductor layer, a gate layer, a source/drain layer, and a plurality of insulating layers disposed between the conductive layers.

The light-emitting layer 102 is disposed on the driving circuit layer, and receives driving signals, control signals, etc. provided by the driving circuit layer to emit light, so as to realize display functions of the display panel. The light-emitting layer 102 comprises a plurality of light-emitting elements with a light-emitting function, and adjacent light-emitting elements are separated by a pixel definition layer to form different pixel regions of the display panel. The light-emitting elements can comprise an anode, a cathode, and a light-emitting functional layer disposed between the anode and the cathode. The light-emitting functional layer can comprise a hole injection layer, a hole transport layer, an organic light-emitting layer, an electron transport layer, and an electron injection layer.

The first adhesive layer 103 is disposed on a light-emitting surface of the light-emitting layer 102 and is connected to the light-emitting layer 102. The first adhesive layer 103 can be an optically clear adhesive for bonding the cover plate 104 and the light-emitting layer 102.

The cover plate 104 is bonded to the light-emitting surface of the light-emitting layer 102 through the first adhesive layer 103 to protect the light-emitting layer 102 and prevent the light-emitting layer 102 from being scratched or damaged by external objects. Optionally, the cover plate 104 comprises glass, and a thickness of the cover plate 104 is less than or equal to 30 micrometers. It can be understood that the glass cover plate with the thickness of less than or equal to 30 micrometers has a certain degree of flexibility, while maintaining good hardness, so as to well protect the light-emitting layer 102.

The second adhesive layer 105 is disposed on another side of the cover plate 104 and is connected to the cover plate 104. Optionally, the second adhesive layer 105 can be an optical clear adhesive for bonding the protective layer 106 to the cover plate 104.

The protective layer 106 is adhered at one side of the cover plate 104 away from the light-emitting layer 102 through the second adhesive layer 105. The protective layer 106 can be a plastic film layer made of organic materials. The protective layer 106 further enhances the flexibility and scratch resistance of the cover plate 104 and forms a smooth surface of the display panel.

Specifically, an orthographic projection of at least a portion of an edge of the second adhesive layer 105 projected on the cover plate 104 is located between two opposite edges of the cover plate 104, so that the second adhesive layer 105 forms a partial indented structure relative to the cover plate 104. It can be understood that in a manufacturing process of the display panel, before the cover plate 104 is bonded to the light-emitting layer 102, a protective film is provided on one side of the cover plate 104 adjacent to the light-emitting layer 102. It is necessary to peel off the protective film before bonding with the light-emitting layer 102. In the present embodiment, the second adhesive layer 105 forms the partial indented structure relative to the cover plate 104, so the protective film does not adhere to the second adhesive layer 105 in an indented area corresponding to the indented structure. This facilitates peeling off the protective film from the indented area, thereby improving production yields of the display panel.

Furthermore, an orthographic projection of at least a portion of the edge of the second adhesive layer 105 projected on the protective layer 106 is located between two opposite edges of the protective layer 106, so that the protective layer 106 protrudes out of the edge of the second adhesive layer 105 and forms sealing and protection for the edge of the second adhesive layer 105.

Further, a minimum distance between an orthographic projection of an edge of the cover plate 104 projected on the protective layer 106 and an edge of the protective layer 106 is less than a minimum distance between an orthographic projection of the edge of the second adhesive layer 105 projected on the protective layer 106 and the edge of the protective layer 106, thereby forming the indented structure of the second adhesive layer 105 relative to the cover plate 104.

Optionally, the orthographic projection of the entire edge of the second adhesive layer 105 projected on the protective layer 106 are located between two opposite edges of the protective layer 106. In the present embodiment, the protective layer 106 can form relatively complete sealing and protection for the edge of the second adhesive layer 105, and further form sealing and protection for the cover plate 104.

Further, the orthographic projection of the edge of the cover plate 104 projected on the protective layer 106 is located between two opposite edges of the protective layer 106, so the protective layer 106 protrudes out from the edge of the cover plate 104, which is advantageous to form better sealing and protection for the edge of the cover plate 104.

Optionally, an orthographic projection of the second adhesive layer 105 projected on the protective layer 106 comprises an indented portion and a protruding portion adjacent to the indented portion. A distance between an edge of the indented portion and an edge of the protruding portion is greater than or equal to 1 mm. It can be understood that in the manufacturing process of the display panel, when the protective film located on one side of the cover plate 104 is peeled off, starting the peeling from the indented portion can greatly improve efficiency and smoothness of a peeling process. By having the distance between the edge of the indented portion and the edge of the protruding portion be greater than or equal to 1 mm, production yields of processing the indented portion are improved in view of machining accuracy.

Furthermore, the display panel has a plurality of corner regions C. A portion of the edge of the second adhesive layer 105 corresponding to at least one of the corner regions C has an orthographic projection which is projected on the cover plate 104 and located between two opposite edges of the cover plate 104. Moreover, the portion of the edge of the second adhesive layer 105 corresponding to at least one of the corner regions C has an orthographic projection which is projected on the protective layer 106 and located between the two opposite edges of the protective layer 106. It can be understood that in the manufacturing process of the display panel, when the protective film located on one side of the cover plate 104 is peeled off, starting the peeling from the corner regions C can greatly improve the efficiency and smoothness of the peeling process. In the present embodiment, the second adhesive layer 105 forms in the corner region C the indented structure relative to the cover plate 104, thereby ensuring that the protective film in this region does not bond with the second adhesive layer 105. Accordingly, such a design facilitates peeling off the protective film from the corner region C, thereby further improving the efficiency and yields of peeling off the protective film. Furthermore, in at least one of the corner regions C, the minimum distance between the orthographic projection of the edge of the cover plate 104 projected on the protective layer 106 and the edge of the protective layer 106 is less than the minimum distance between the orthographic projection of the edge of the second adhesive layer 105 projected on the protective layer 106 and the edge of the protective layer 106.

Further, in at least one of the corner regions C, the orthographic projection of the second adhesive layer 105 projected on the protective layer 106 comprises the indented portion and the protruding portion adjacent to the indented portion. The distance between the edge of the indented portion and the edge of the protruding portion is greater than or equal to 1 mm. In at least one of the corner regions C, a distance between an edge of the orthographic projection of the second adhesive layer 105 projected on the cover plate 104 and the edge of the cover plate 104 is greater than 0. In the corner region C, a distance between an edge of the orthographic projection of the cover plate 104 projected on the protective layer 106 and the edge of the protective layer 106 is greater than 0.

Further, the display panel further comprises a light-shielding layer 107 disposed on a surface of the protective layer 106 facing the second adhesive layer 105. The light-shielding layer 107 is disposed along the edge of the protective layer 106 and is annular in shape. The light-shielding layer 107 is used for shielding light from the edge of the display panel, so as to improve the appearance quality and display quality of the display panel. It should be noted that in order to clearly show the intended structure of the second adhesive layer 105, FIG. 2 only shows a partial area of the light-shielding layer 107, and in an area where the second adhesive layer 105 overlaps with the light-shielding layer 107, the light-shielding layer 107 is not shown.

Optionally, the light-shielding layer 107 can be formed by coating black ink on one side of the protective layer 106. A portion of a surface of the light-shielding layer 107 facing the light-emitting layer 102 can be connected to the second adhesive layer 105 and other portions of the surface of the light-shielding layer 107 facing the light-emitting layer 102 are suspended. The surface of the light-shielding layer 107 facing the light-emitting layer 102 can also be connected to the cover plate 104 and the first adhesive layer 103.

Figure 4:
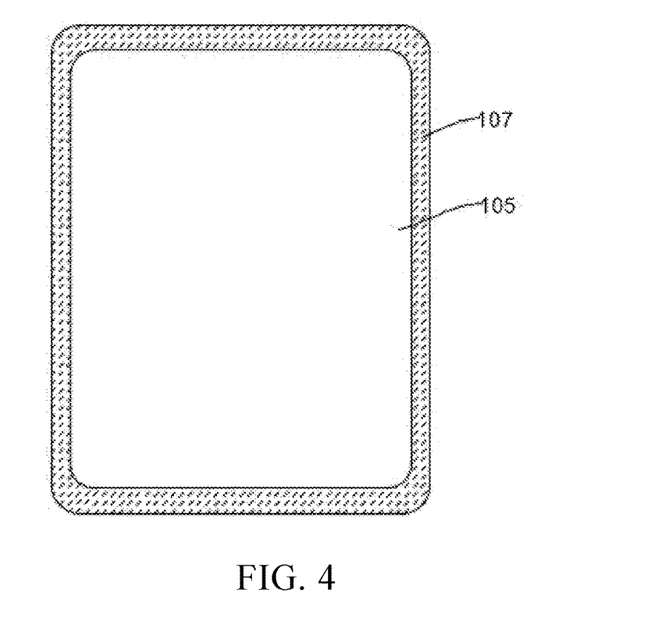
FIG. 4 is a partial structural view illustrating the film layer structure of the display panel according to a second embodiment of the present application.

Please further refer to FIG. 4. FIG. 4 is a partial structural view illustrating the film layer structure of the display panel according to a second embodiment of the present application. The display panel shown in FIG. 4 and the display panel shown in FIG. 2 have the same or similar film layer structure. The only difference is that the second adhesive layer 105 has a different indented area relative to the cover plate 104.

In the display panel shown in FIG. 4, the orthographic projection of the entire edge of the second adhesive layer 105 projected on the cover plate 104 is located between two opposite edges of the cover plate 104. The orthographic projection of the edge of the second adhesive layer 105 projected on the protective layer 106 is located between two opposite edges of the protective layer 106. In the present embodiment, a complete indented structure of the second adhesive layer 105 relative to the cover plate 104 is formed, thus preventing the protective film and the second adhesive layer 105 respectively disposed on two sides of the cover plate from adhering to each other in any position at the entire edge of the cover plate 104. Accordingly, the protective film can be easily peeled off from any area at the edge of the cover plate 104, thereby further improving the efficiency and yields of peeling off the protective film.

Optionally, a shape of the orthographic projection of the second adhesive layer 105 projected on the protective layer 106 is same as a shape of the orthographic projection of the cover plate 104 projected on the light-emitting layer 102. Moreover, the orthographic projection of the entire edge of the second adhesive layer 105 projected on the cover plate 104 is located between two opposite edges of the cover plate 104. In the present embodiment, the second adhesive layer 105 and the cover plate 104 have the same shape, which is beneficial to improve production efficiency and precision because the cover plate 104 can be used as a reference to manufacture the second adhesive layer 105.

Furthermore, considering an accurate positional connection relation between the cover plate 104 and the protective layer 106, following arrangements are made: the distance from the orthographic projection of at least the portion of the edge of the second adhesive layer 105 projected on the cover plate 104 to the edge of the cover plate 104 is greater than or equal to 1 mm.

In order to further ensure that the second adhesive layer 105 and the protective film on two sides of the cover plate 104 are not connected in the indented area, and to consider cutting accuracy of a cover plate assembly, the following arrangements are made: A distance between the orthographic projection of at least the portion of the edge of the second adhesive layer 105 projected on the cover plate 104 and the edge of the cover plate 104 is greater than or equal to 3 mm.

To sum up, in the present application, the orthographic projection of at least the portion of the edge of the second adhesive layer 105 projected on the cover plate 104 is located between the two opposite edges of the cover plate 104, so that the second adhesive layer 105 does not overlap the edge of the cover plate 104, and thereby the second adhesive layer 105 forms the partial indented structure relative to the cover plate 104. In the process of manufacturing the display panel, the protective film and the second adhesive layer 105 disposed on two sides of the cover plate 104 do not adhere in the area corresponding to the indented structure, so that the protective film can be easily peeled off from the area of the indented structure, thereby improving the production yields of the display panel.

The present application further provides a cover plate assembly for use in a display panel. It can be understood that the cover plate assembly is used in the display panel of the above-mentioned embodiments, and provides technical features described in the above-mentioned embodiments. Please refer to FIG. 5, which is a schematic structural view of the cover plate assembly according to one embodiment of the present application.

Figure 5:
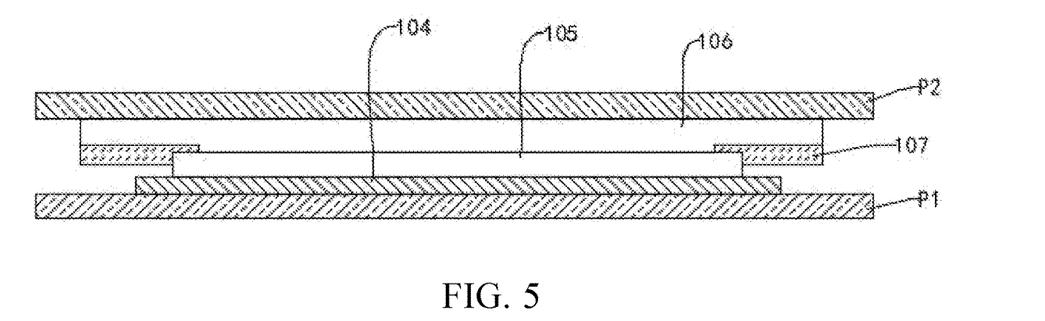
FIG. 5 is a schematic structural view illustrating a cover plate assembly according to one embodiment of the present application.

The cover plate assembly comprises: a first protective film P1, a cover plate 104 disposed on one side of the first protective film P1, an adhesive layer 105 disposed on one side of the cover plate 104 away from the first protective film P1, a protective layer 106 disposed on one side of the second adhesive layer 105 away from the cover plate 104, and a second protective film P2 disposed on one side of the protective layer 106 away from the second adhesive layer 105. The second adhesive layer 105 is connected to the cover plate 104, and the protective layer 106 is connected to the second adhesive layer 105. The cover plate 104 is attached to the first protective film P1 through a vacuum bonding method or a weak bonding method. The second protective film P2 is attached to the protective layer 106 through vacuum bonding or weak bonding.

An orthographic projection of at least a portion of an edge of the second adhesive layer 105 projected on the cover plate 104 is located between two opposite edges of the cover plate 104, so that the second adhesive layer 105 forms a partial indented structure relative to the cover plate 104. It can be understood that when the cover plate assembly is used in the display panel, the first protective film P1 needs to be peeled off first, and then bonded to a display module through an optical clear adhesive. The second adhesive layer 105 forms the partial indented structure relative to the cover plate 104, so that in an indented area corresponding to the indented structure, the first protective film P1 does not adhere to the second adhesive layer 105. Accordingly, it is convenient and easy to peel off the first protective film P1 from the indented area.

Further, an orthographic projection of at least a portion of the edge of the second adhesive layer 105 projected on the protective layer 106 is located between two opposite edges of the protective layer 106, so that the protective layer 106 protrudes out of the edge of the second adhesive layer 105, thus forming sealing and protection for the edge of the second adhesive layer 105. Optionally, an orthographic projection of the entire edge of the second adhesive layer 105 projected on the protective layer 106 is located within the protective layer 106 and does not overlap with the edge of the protective layer 106.

Further, an orthographic projection of an edge of the cover plate 104 projected on the protective layer 106 is located between two opposite edges of the protective layer 106, so that the protective layer 106 protrudes out of the edge of the cover plate 104, which is advantageous to form better sealing and protection for the edge of the cover plate 104.

Furthermore, the display panel further comprises a light-shielding layer 107 disposed on a surface of the protective layer 106 facing the second adhesive layer 105. The light-shielding layer 107 is disposed along the edge of the protective layer 106 and is annular-shaped.

Figure 6:
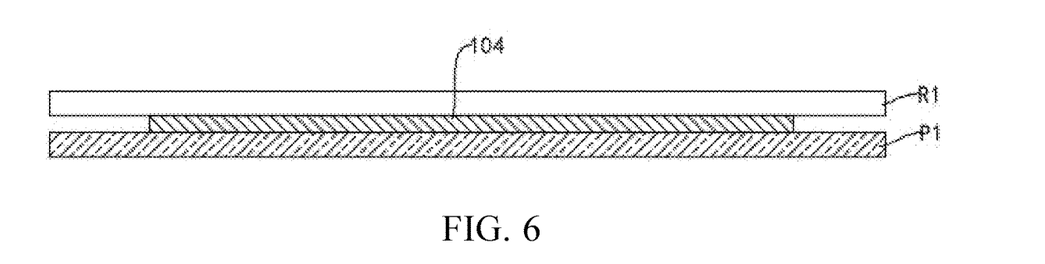
FIG. 6 is a schematic structural view illustrating a first member for producing a cover plate assembly according to one embodiment of the present application.
Figure 7:
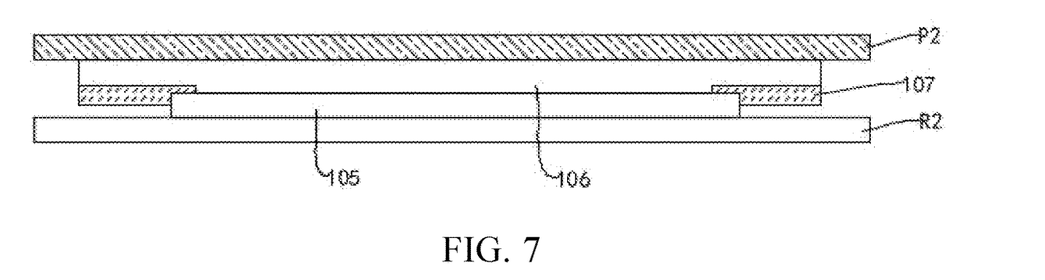
FIG. 7 is a schematic structural view illustrating a second member for producing the cover plate assembly according to one embodiment of the present application.

Please refer to FIG. 5 to FIG. 7 for the manufacturing process of the cover plate assembly. FIG. 6 is a schematic structural view of a first member for manufacturing the cover plate assembly according to one embodiment of the present application. FIG. 7 is a schematic structural view of a second member for manufacturing the cover plate assembly according to one embodiment of the present application. The first member comprises a first release film R1, the cover plate 104, and the first protective film P1. The second member comprises a second release film R2, the second adhesive layer 105, the protective layer 106, and a second protective film P2. The second member can further comprise the light-shielding layer 107 disposed along the protective layer 106.

In making the cover plate assembly, first the first release film R1 of the first member is peeled off, and the second release film R2 of the second member is peeled off. Then, the cover plate 104 of the first member is connected to the second adhesive layer 105 of the second member, so that at least a portion of the edge of the second adhesive layer 105 is indented relative to the cover plate 104 to form the cover plate assembly shown in FIG. 5.

In summary, in the cover plate assembly of the present application, the orthographic projection of at least the portion of the edge of the second adhesive layer 105 projected on the cover plate 104 is located between two opposite edges of the cover plate 104 and does not overlap with the edge of the cover plate 104, so that the second adhesive layer 105 forms the partial indented structure relative to the cover plate. Accordingly, in the indented area corresponding to the indented structure, the first protective film P1 does not adhere to the second adhesive layer 105. Therefore, the first protective film P1 is easily peeled off from the indented area, which facilitates efficient assembly of the cover plate assembly.

It should be noted that although the present application is disclosed above with reference to specific embodiments, the above embodiments are not intended to limit the present application. Those of ordinary skill in the art can make various modifications without departing from the spirit and scope of the present application. Therefore, the protection scope of the present application is defined by the appended claims.

What is claimed is:

1. A display panel, comprising:
a light-emitting layer;

a first adhesive layer disposed on a light-emitting surface of the light-emitting layer and connected to the light-emitting layer;

a cover plate disposed on one side of the first adhesive layer away from the light-emitting layer and connected to the first adhesive layer;

a second adhesive layer disposed on one side of the cover plate away from the first adhesive layer and connected to the cover plate, wherein an orthographic projection of at least a portion of an edge of the second adhesive layer projected on the cover plate is located between two opposite edges of the cover plate; and a protective layer arranged on one side of the second adhesive layer away from the cover plate and connected to the second adhesive layer, wherein a light-shielding layer is disposed on a surface of the protective layer facing the second adhesive layer, and the light-shielding layer is annular-shaped and disposed along an edge of the protective layer, wherein a portion of a surface of the light-shielding layer facing the light-emitting layer is connected to the second adhesive layer, and other portions of the surface of the light-shielding layer facing the light-emitting layer are suspended.

2. The display panel according to claim 1, wherein an orthographic projection of at least a portion of the edge of the second adhesive layer projected on the protective layer is located between two opposite edges of the protective layer.

3. The display panel according to claim 2, wherein a minimum distance between an edge of an orthographic projection of the cover plate projected on the protective layer and an edge of the protective layer is less than a minimum distance between an edge of an orthographic projection of the second adhesive layer projected on the protective layer and the edge of the protective layer.

4. The display panel according to claim 2, wherein the display panel comprises a plurality of corner regions; and in at least one of the corner regions, a minimum distance between an edge of an orthographic projection of the cover plate projected on the protective layer and an edge of the protective layer is less than a minimum distance between an edge of an orthographic projection of the second adhesive layer projected on the protective layer and the edge of the protective layer.

5. The display panel according to claim 4, wherein in at least one of the corner regions, an orthographic projection of the second adhesive layer projected on the protective layer comprises an indented portion and a protruding portion adjacent to the indented portion, and a distance between an edge of the indented portion and an edge of the protruding portion is greater than or equal to 1 mm.

6. The display panel according to claim 5, wherein in at least one of the corner regions, a distance between an edge of an orthographic projection of the second adhesive layer projected on the cover plate and an edge of the cover plate is greater than 0.

7. The display panel according to claim 6, wherein in at least one of the corner regions, a distance between an edge of an orthographic projection of the cover plate projected on the protective layer and the edge of the protective layer is greater than 0.

8. The display panel according to claim 1, wherein the light-shielding layer comprises black ink coated on one side of the protective layer.

9. The display panel according to claim 1, wherein a surface of the light-shielding layer facing the light-emitting layer is connected to the cover plate and the first adhesive layer.

10. The display panel according to claim 1, wherein a distance between the orthographic projection of at least the portion of the edge of the second adhesive layer projected on the cover plate and an edge of the cover plate is greater than or equal to 1 mm.

11. The display panel according to claim 10, wherein the distance between the orthographic projection of the at least the portion of the edge of the second adhesive layer projected on the cover plate and the edge of the cover plate is greater than or equal to 3 mm.

12. The display panel according to claim 1, wherein a shape of an orthographic projection of the second adhesive layer projected on the light-emitting layer is same as a shape of an orthographic projection of the cover plate projected on the light-emitting layer.

13. The display panel according to claim 1, wherein the cover plate comprises glass, and a thickness of the glass is less than or equal to 30 micrometers.

14. A cover plate assembly for use in a display panel, wherein the cover plate assembly comprises:

a first protective film;

a cover plate disposed on one side of the first protective film;

a second adhesive layer disposed on one side of the cover plate away from the first protective film and connected to the cover plate, wherein an orthographic projection of at least a portion of an edge of the second adhesive layer projected on the cover plate is located between two opposite edges of the cover plate;

a protective layer arranged on one side of the second adhesive layer away from the cover plate and connected to the second adhesive layer, wherein a light-shielding layer is disposed on a surface of the protective layer facing the second adhesive layer, and the light-shielding layer is annular-shaped and disposed along an edge of the protective layer, wherein a portion of a surface of the light-shielding layer facing the light-emitting layer is connected to the second adhesive layer, and other portions of the surface of the light-shielding layer facing the light-emitting layer are suspended; and a second protective film disposed on one side of the protective layer away from the second adhesive layer.

15. The cover plate assembly according to claim 14, wherein an orthographic projection of at least a portion of the edge of the second adhesive layer projected on the protective layer is located between two opposite edges of the protective layer.

16. The cover plate assembly according to claim 15, wherein a minimum distance between an edge of an orthographic projection of the cover plate projected on the protective layer and an edge of the protective layer is less than a minimum distance between an edge of an orthographic projection of the second adhesive layer projected on the protective layer and the edge of the protective layer.

17. The cover plate assembly according to claim 14, wherein a light-shielding layer is disposed on a surface of the protective layer facing the second adhesive layer, and the light-shielding layer is annular in shape and disposed along an edge of the protective layer.

18. The cover plate assembly according to claim 14, wherein a distance between the orthographic projection of the at least the portion of the edge of the second adhesive layer projected on the cover plate and an edge of the cover plate is greater than or equal to 3 mm.

19. A display panel, comprising:
a light-emitting layer;
a first adhesive layer disposed on a light-emitting surface of the light-emitting layer and connected to the light-emitting layer;
a cover plate disposed on one side of the first adhesive layer away from the light-emitting layer and connected to the first adhesive layer;
a second adhesive layer disposed on one side of the cover plate away from the first adhesive layer and connected to the cover plate, wherein an orthographic projection of at least a portion of an edge of the second adhesive layer projected on the cover plate is located between two opposite edges of the cover plate;
a protective layer arranged on one side of the second adhesive layer away from the cover plate and connected to the second adhesive layer, wherein an orthographic projection of at least a portion of the edge of the second adhesive layer projected on the protective layer is located between two opposite edges of the protective layer; and
a plurality of corner regions, wherein in at least one of the corner regions, a minimum distance between an edge of an orthographic projection of the cover plate projected on the protective layer and an edge of the protective layer is less than a minimum distance between an edge of an orthographic projection of the second adhesive layer projected on the protective layer and the edge of the protective layer,
wherein in at least one of the corner regions, an orthographic projection of the second adhesive layer projected on the protective layer comprises an indented portion and a protruding portion adjacent to the indented portion, and a distance between an edge of the indented portion and an edge of the protruding portion is greater than or equal to 1 mm.

20. The display panel according to claim 19, wherein a distance between the orthographic projection of at least the portion of the edge of the second adhesive layer projected on the cover plate and an edge of the cover plate is greater than or equal to 1 mm.

* * * * *